United States Patent
Cho et al.

(10) Patent No.: US 9,054,098 B2
(45) Date of Patent: Jun. 9, 2015

(54) INTEGRATED CIRCUIT PACKAGING SYSTEM WITH REDISTRIBUTION LAYER AND METHOD OF MANUFACTURE THEREOF

(75) Inventors: NamJu Cho, Uiwang-si (KR); HeeJo Chi, Ichon-si (KR); ChanHoon Ko, Incheon (KR)

(73) Assignee: STATS ChipPAC Ltd., Singapore (SG)

( * ) Notice: Subject to any disclaimer, the term of this patent is extended or adjusted under 35 U.S.C. 154(b) by 272 days.

(21) Appl. No.: 13/221,894

(22) Filed: Aug. 30, 2011

(65) Prior Publication Data
US 2013/0049208 A1    Feb. 28, 2013

(51) Int. Cl.
| | |
|---|---|
| *H01L 23/535* | (2006.01) |
| *H01L 23/498* | (2006.01) |
| *H01L 23/31* | (2006.01) |
| *H01L 25/03* | (2006.01) |
| *H01L 21/56* | (2006.01) |

(52) U.S. Cl.
CPC ...... *H01L 23/49861* (2013.01); *H01L 23/4985* (2013.01); *H01L 23/3128* (2013.01); *H01L 23/3135* (2013.01); *H01L 25/03* (2013.01); *H01L 23/49816* (2013.01); *H01L 2224/48227* (2013.01); *H01L 2224/73265* (2013.01); *H01L 2924/15311* (2013.01); *H01L 2924/19107* (2013.01); *H01L 2224/16225* (2013.01); *H01L 2224/32225* (2013.01); *H01L 2224/73204* (2013.01); *H01L 2924/1815* (2013.01); *H01L 21/563* (2013.01); *H01L 21/565* (2013.01)

(58) Field of Classification Search
USPC ........................................ 257/66, 666, 686
See application file for complete search history.

(56) References Cited

U.S. PATENT DOCUMENTS

| | | | | |
|---|---|---|---|---|
| 5,444,303 | A  * | 8/1995 | Greenwood et al. | 257/786 |
| 5,866,939 | A  * | 2/1999 | Shin et al. | 257/666 |
| 5,929,522 | A  * | 7/1999 | Weber | 257/738 |
| 6,316,291 | B1 * | 11/2001 | Weber | 438/127 |
| 6,476,331 | B1 * | 11/2002 | Kim et al. | 174/261 |
| 6,836,008 | B2 * | 12/2004 | Yu et al. | 257/692 |
| 7,898,072 | B2 * | 3/2011 | Kim et al. | 257/686 |
| 7,952,176 | B2 | 5/2011 | Pagaila et al. | |
| 2009/0152547 | A1 * | 6/2009 | Park et al. | 257/48 |
| 2010/0109138 | A1 * | 5/2010 | Cho | 257/686 |
| 2010/0123251 | A1 * | 5/2010 | Chow et al. | 257/773 |
| 2010/0213608 | A1 * | 8/2010 | Lau et al. | 257/737 |
| 2011/0157851 | A1 * | 6/2011 | Lin et al. | 361/757 |

* cited by examiner

*Primary Examiner* — Chuong A Luu
*Assistant Examiner* — Jaehwan Oh
(74) *Attorney, Agent, or Firm* — Ishimaru & Associates LLP

(57) ABSTRACT

A method of manufacture of an integrated circuit packaging system includes: forming a peripheral interconnect having a bond finger and a contact pad with a trace in direct contact with the bond finger and the contact pad, the bond finger vertically offset from the contact pad; connecting an integrated circuit die and the bond finger; and forming a module encapsulation on the integrated circuit die, the bond finger and the trace exposed from the module encapsulation.

20 Claims, 6 Drawing Sheets

US 9,054,098 B2

INTEGRATED CIRCUIT PACKAGING SYSTEM WITH REDISTRIBUTION LAYER AND METHOD OF MANUFACTURE THEREOF

TECHNICAL FIELD

The present invention relates generally to an integrated circuit packaging system, and more particularly to a system with a redistribution layer.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for testing packages with ever smaller connections influences manufacturing processes.

Testing components with small connectors can easily damage the connectors. Damaged connectors will be harder to bond to, which can decrease reliability of the entire package and yield in manufacturing.

Thus, a need still remains for reliable manufacturing of integrated circuit packages. In view of the decreasing size of packages and connectors, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a peripheral interconnect having a bond finger and a contact pad with a trace in direct contact with the bond finger and the contact pad, the bond finger vertically offset from the contact pad; connecting an integrated circuit die and the bond finger; and forming a module encapsulation on the integrated circuit die, the bond finger and the trace exposed from the module encapsulation.

The present invention provides an integrated circuit packaging system, including: a peripheral interconnect having a bond finger and a contact pad with a trace in direct contact with the bond finger and the contact pad, the bond finger vertically offset from the contact pad; an integrated circuit die connected to the bond finger; and a module encapsulation on the integrated circuit die, the bond finger and the trace exposed from the module encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
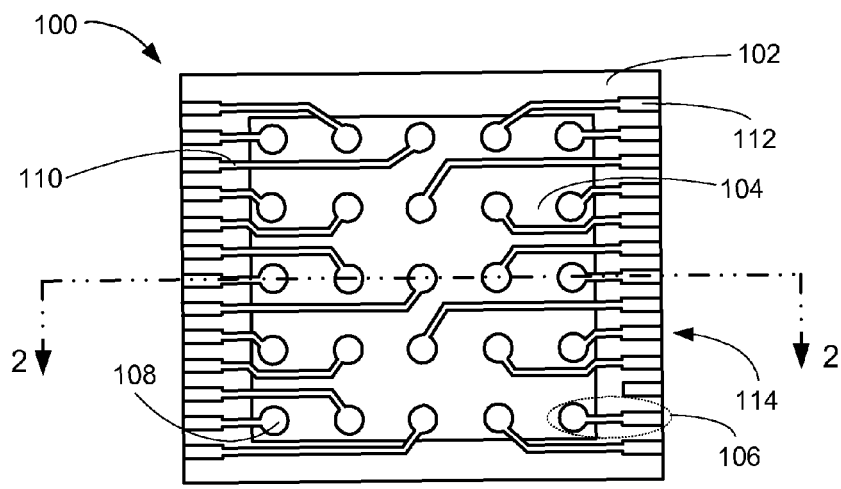
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between two elements with no intervening elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown with a module encapsulation 102, a curable base adhesive 104, and a peripheral interconnect 106.

The peripheral interconnects 106 can form a redistribution layer 114. The peripheral interconnect 106 can include a contact pad 108, a trace 110, and a bond finger 112. The peripheral interconnect 106 is defined as a conductive structure terminating on the periphery of a component. For example, the peripheral interconnect 106 can redistribute a signal from the edge of the integrated circuit packaging system 100 to the interior of the integrated circuit packaging system 100, or vice-versa. The contact pad 108 can be directly connected to the trace 110, which can in turn be connected directly to the bond finger 112.

The trace 110 can have a width that is much narrower than the width of the contact pad 108 and the bond finger 112. The trace 110 can be formed from the same material as the contact pad 108 and the bond finger 112.

The size differential between the trace 110 and the contact pad 108 can function to keep a solder ball on the contact pad 108 from migrating to the trace 110 because of the surface tension of the solder, for example. Also for example, microstructures such as holes or depressions can be formed on the trace 110 next to the contact pad 108 in order to prevent a solder ball from deforming and moving off the contact pad 108. As a further example, the relatively narrow width of the trace 110 as compared to the contact pad 108 and the bond finger 112 can help redistribute signals while minimizing the chance of electrical shorts and crosstalk.

The contact pad 108 and a portion of the trace 110 can be embedded in the curable base adhesive 104. The contact pad 108 and the trace 110 can remain exposed from the curable base adhesive 104. The bond finger 112 and the trace 110 can be embedded in but exposed from the module encapsulation 102. The bond fingers 112 can be arranged on any number of the sides of the integrated circuit packaging system 100 from just one side to two sides in any configuration including opposite each other, to all four sides.

Figure 2:
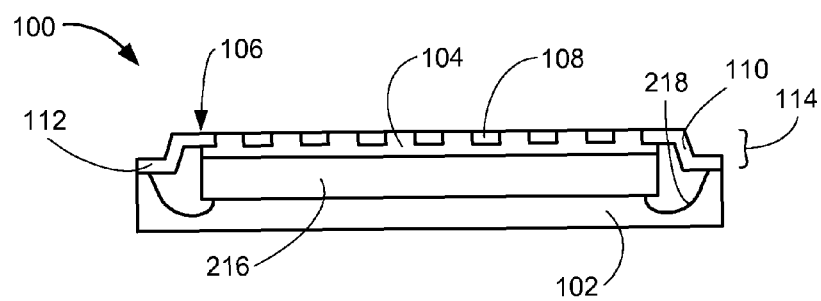
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having an integrated circuit die 216, a chip interconnect 218, the module encapsulation 102, the curable base adhesive 104, and the redistribution layer 114. For example, the integrated circuit die 216 can be a wire-bond chip.

The redistribution layer 114 can include a plurality of the peripheral interconnects 106 in a pattern. The peripheral interconnect 106 can include the bond finger 112, the contact pad 108 vertically offset from the bond finger 112, and the trace 110 electrically connecting the bond finger 112 and the contact pad 108. There can be a single instance of the contact pad 108 connected to each instance of the bond finger 112 by a corresponding instance of the trace 110.

The vertical offset of the contact pad 108 and the bond finger 112 can have the non-active side of the integrated circuit die 216 coplanar with the exposed surface of the bond finger 112. This vertical offset can allow for a lower profile package as the vertical offset can have enough space to allow for a bond wire to be attached to the bond finger 112 without going above the level of the contact pad 108.

The contact pad 108 can be exposed from the curable base adhesive 104 and the bond finger 112 can be exposed from the module encapsulation 102. The trace 110 can be exposed from the curable base adhesive 104 and the module encapsulation 102. The contact pad 108 can function as a bond site or as a test site. If the contact pad 108 is used as a test pad, the contact pad 108 can have a thicker layer of metal on the outer surface of the contact pad 108 in order to minimize the damage done to the contact pad 108 in the standard course of testing.

The contact pad 108 can be round in shape, though it is understood that the contact pad 108 can be different shapes based on need. For example, the contact pad 108 can be square, oval, rectangular, or other regular shape. The bond finger 112 is shown as rectangular in shape, though it is understood that the bond finger 112 can be different shapes as necessary. For example, the bond finger 112 can be square, oval, trapezoidal, or irregularly shaped.

It has been discovered that the sizing of the contact pad 108 relative to the trace 110 allows for reliable and efficient testing of the integrated circuit packaging system 100. For example, the relatively large size of the contact pad 108 can allow reliable use of the contact pad 108 as a test pad utilizing an automated "bed of nails" test probe array without spending extra time on constant realignment. Also for example, the narrow width of the trace relative to the contact pad 108 can allow more of the contact pads 108 to be created on the surface of the integrated circuit packaging system 100 due to the ability to place the traces 110 close to each other.

The trace 110 can connect the contact pad 108 and the bond finger 112 so that the contact pad 108 and the bond finger 112 are electrically connected. The contact pads 108 can be arranged in an array.

It has been discovered that having the contact pad 108 and the bond finger 112 both available for connection allows for testing the integrated circuit packaging system 100 while leaving the contact pad 108 or the bond finger 112 undamaged. For example, if the contact pad 108 is used as a test site, the bond finger 112 will remain undamaged but every connection in the integrated circuit packaging system 100 can be tested.

The redistribution layer 114 can be formed from metal in various ways. For example, the redistribution layer 114 can be formed by masking then plating, sputtering, or chemical vapor deposition. The redistribution layer 114 can be formed such that the contact pad 108 is at a different vertical height than the bond finger 112. The difference in vertical height can create a bend in the trace 110 that connects the bond finger 112 to the contact pad 108.

The trace 110 can have a section which is coplanar with the bond finger 112 and another section coplanar with the contact pad 108. The trace 110 can also have a section between the previously mentioned coplanar sections which is at an obtuse angle relative to the coplanar sections. The angled section of the trace 110 can traverse the difference in vertical height between the bond finger 112 and the contact pad 108 for connection.

It has been discovered that the bond finger 112 at a different vertical height than the contact pad 108 allows for an easily testable low-profile package. For example, with the bond finger 112 vertically offset lower than the contact pad 108, bond wires or z-interconnects on the bond finger 112 can be encapsulated while still leaving the contact pad 108 exposed for further connection without adding extra height to the package. Also for example, the vertical offset between the bond finger 112 and the contact pad 108 while connected via the trace 110 allows redistribution of signals without adding extra vertical height because bond wires or z-interconnects can be connected to the bond finger 112 without the necessity of encapsulating the bond wires at a height greater than the contact pad 108. As a further example, since the bond finger 112 and the contact pad 108 are electrically connected, the contact pad 108 can be used as a test site so that the bond finger 112 remains undamaged for easy connection to a tested package.

The redistribution layer 114 can be composed of multiple metal layers. For example, the redistribution layer 114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 114 can be formed in many separate steps. For example, the protection layer can protect against etching, and the adhesion layer can be deposited after etching. Also for example, the wettable layer can be added over the adhesion layer.

The curable base adhesive 104 can be on and between the contact pads 108. The curable base adhesive 104 can be on and partially around the contact pad 108. The curable base adhesive 104 is defined as a curable, non-conductive material with adhesive properties. The curable base adhesive 104 can be a curable, non-conductive die adhesive, for example. The curable base adhesive 104 can fully cover the back side of the integrated circuit die 216. The curable base adhesive 104 can function to ensure that the instances of the contact pad 108 are electrically separate from each other.

For illustrative purposes, the curable base adhesive 104 is shown as not contacting the angled section of the trace 110, although it is understood that the curable base adhesive 104 could cover a larger area than is covered by the integrated circuit die 216. For example, the curable base material could cover a portion of the angled section of the trace 110 without contacting the bond finger 112.

It has been discovered that the curable base adhesive 104 around a plurality of the contact pad 108 allows the integrated circuit packaging system 100 to be formed as a thinner package because the integrated circuit packaging system 100 can be formed without a laminate substrate. For example, due to the redistribution layer 114 being held in place by the curable base adhesive 104 and the module encapsulation 102 rather than a laminate substrate, the integrated circuit packaging system 100 can be formed as a low-profile package since the integrated circuit packaging system 100 will have fewer components than a package that has a laminate substrate.

The integrated circuit die 216 can be attached to the contact pad 108 by the curable base adhesive 104. The integrated circuit die 216 can be electrically connected to the bond finger 112 by the chip interconnect 218. For example, the chip interconnect 218 can connect the integrated circuit die 216 to the bond finger 112, and the trace 110 can connect the bond finger 112 to the contact pad 108. In this example, the chip interconnect 218 can be a bond wire or bond ribbon.

The module encapsulation 102 can be formed on the integrated circuit die 216, the bond finger 112, the curable base adhesive 104, and the chip interconnect 218. The module encapsulation 102 is defined as a solid protective molding for the integrated circuit packaging system 100. The module encapsulation 102 can cover one side of the redistribution layer 114 while leaving the other side exposed. The module encapsulation 102 can fully cover the integrated circuit die 216 and can contact the curable base adhesive 104. For example, the module encapsulation 102 can include an epoxy molding compound or a moldable underfill.

Figure 3:
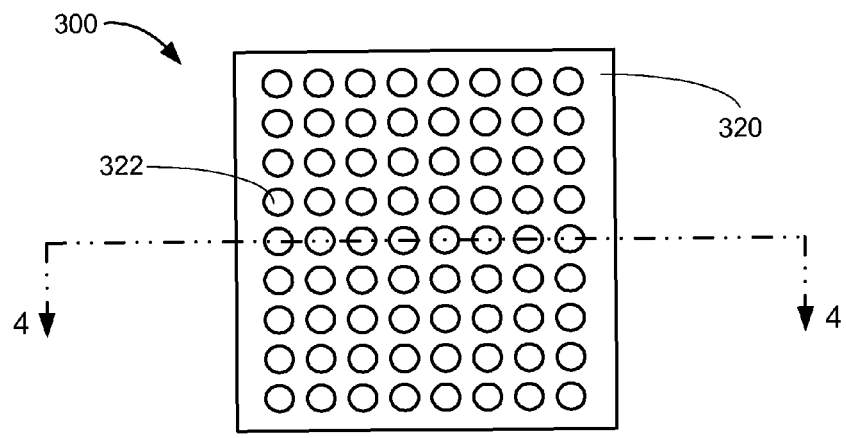
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The integrated circuit packaging system 300 is shown having a chip carrier 320 and an external interconnect 322. The chip carrier 320 is defined as a structure containing conductive traces and contacts. For example, the chip carrier 320 can be a laminate substrate, a ceramic substrate, a silicon substrate, a leadframe, or some other structure for redistribution of signals. The external interconnect 322 can be attached to the chip carrier 320.

The external interconnect 322 is defined as an interface connector for connecting an integrated circuit package to a next level system (not shown). For example, the external interconnect 322 can be a solder ball, a solder bump, a stud bump, a conductive pillar, or other conductive structure.

Figure 4:
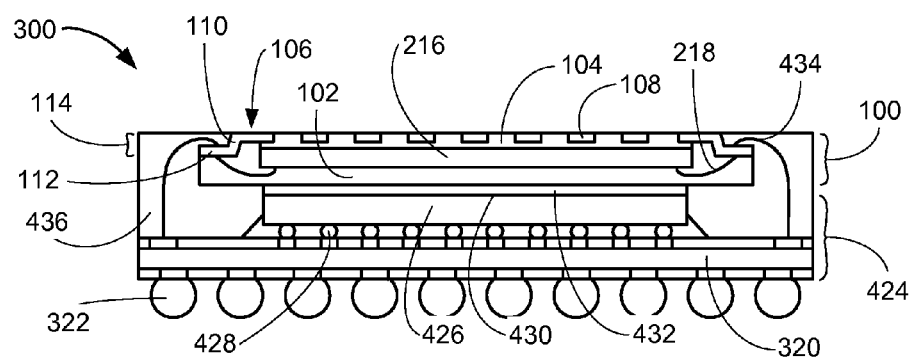
FIG. 4 is shown a cross-sectional view of the integrated circuit packaging system along the section line 4-4 of FIG. 3.

Referring now to FIG. 4, therein is shown a cross-sectional view of the integrated circuit packaging system 300 along the section line 4-4 of FIG. 3. The integrated circuit packaging system 300 is shown having a base device 424, a module interconnect 434, the integrated circuit packaging system 100, the external interconnect 322, and a package encapsulation 436, as an example.

The redistribution layer 114 can include a plurality of the peripheral interconnects 106 in a pattern. The peripheral interconnect 106 can include the bond finger 112, the contact pad 108 vertically offset from the bond finger 112, and the trace 110 electrically connecting the bond finger 112 and the contact pad 108. There can be a single instance of the contact pad 108 connected to each instance of the bond finger 112 by a corresponding instance of the trace 110.

The vertical offset of the contact pad 108 and the bond finger 112 can have the non-active side of the integrated circuit die 216 coplanar with the exposed surface of the bond finger 112. This vertical offset can allow for a lower profile package as the vertical offset can have enough space to allow for a bond wire to be attached to the bond finger 112 without going above the level of the contact pad 108.

The integrated circuit packaging system 100 is shown having the integrated circuit die 216, the chip interconnect 218, the module encapsulation 102, the curable base adhesive 104, and the redistribution layer 114. For example, the integrated circuit die 216 can be a wire-bond chip.

The base device 424 can include the chip carrier 320, a base die 426, and an internal interconnect 428. The base device 424 can have a module adhesive 432 on the base device 424. The base device 424 can be different types of integrated circuits. For example, the base device 424 can include a flip chip, a wire-bond chip, or a pre-formed package.

The module adhesive 432 is defined as an adhesive material for attaching other components to the base device 424. For example, the module adhesive 432 can be a wire-in-film adhesive, a die attach adhesive, or a thermally conductive adhesive.

The internal interconnect 428 is defined as an electrical connector for connecting the components in the base device 424 to other components within the base device 424. For example, the internal interconnect 428 can be a solder ball, a metallic bump, a bond wire, a bond ribbon, or a conductive column. The internal interconnect 428 can be on the base die 426 and the chip carrier 320. In this example, the internal interconnect 428 can also support the base die 426 over the chip carrier 320.

The base device 424 can have a device top surface 430. The device top surface 430 is defined as the uppermost planar surface of the base device 424. For example, the device top surface 430 can be the back side of the base die 426. The device top surface 430 can be completely covered by the module adhesive 432. The module adhesive 432 can be used to attach the integrated circuit packaging system 100 to the device top surface 430 of the base device 424. The module adhesive 432 can be on and between the device top surface 430 and the integrated circuit packaging system 100.

The contact pad 108 can be exposed from the curable base adhesive 104 and the bond finger 112 can be exposed from the module encapsulation 102. The contact pad 108 can function as a bond site or as a test site. If the contact pad 108 is used as a test pad, the contact pad 108 can have a thicker layer of metal on the outer surface of the contact pad 108 in order to minimize the damage done to the contact pad 108 in the standard course of testing.

The contact pad 108 can be round in shape, though it is understood that the contact pad 108 can be different shapes based on need. For example, the contact pad 108 can be square, oval, rectangular, or other regular shape. The bond finger 112 is shown as rectangular in shape, though it is understood that the bond finger 112 can be different shapes as necessary. For example, the bond finger 112 can be square, oval, trapezoidal, or irregularly shaped.

The trace 110 can connect the contact pad 108 and the bond finger 112 so that the contact pad 108 and the bond finger 112 are electrically connected. The contact pads 108 can be arranged in an array.

It has been discovered that having the contact pad 108 and the bond finger 112 both available for connection allows for testing the integrated circuit packaging system 100 while leaving the contact pad 108 or the bond finger 112 undamaged. For example, if the contact pad 108 is used as a test site, the bond finger 112 will remain undamaged but every connection in the integrated circuit packaging system 100 can be tested.

The redistribution layer 114 can be formed from metal in various ways. For example, the redistribution layer 114 can be formed by masking then plating, sputtering, or chemical vapor deposition. The redistribution layer 114 can be formed such that the contact pad 108 is at a different vertical height than the bond finger 112. The difference in vertical height can create a bend in the trace 110 that connects the bond finger 112 to the contact pad 108.

The trace 110 can have a section which is coplanar with the bond finger 112 and another section coplanar with the contact pad 108. The trace 110 can also have a section between the previously mentioned coplanar sections which is at an obtuse angle relative to the coplanar sections. The angled section of the trace 110 can traverse the difference in vertical height between the bond finger 112 and the contact pad 108 for connection.

It has been discovered that the bond finger 112 at a different vertical height than the contact pad 108 allows for an easily testable low-profile package. For example, with the bond finger 112 vertically offset lower than the contact pad 108, bond wires or z-interconnects on the bond finger 112 can be encapsulated while still leaving the contact pad 108 exposed for further connection without adding extra height to the package. Also for example, the vertical offset between the bond finger 112 and the contact pad 108 while connected via the trace 110 allows redistribution of signals without adding extra vertical height because bond wires or z-interconnects can be connected to the bond finger 112 without the necessity of encapsulating the bond wires at a height greater than the contact pad 108. As a further example, since the bond finger 112 and the contact pad 108 are electrically connected, the contact pad 108 can be used as a test site so that the bond finger 112 remains undamaged for easy connection to a tested package.

The redistribution layer 114 can be composed of multiple metal layers. For example, the redistribution layer 114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 114 can be formed in many separate steps. For example, the protection layer can protect against etching, and the adhesion layer can be deposited after etching. Also for example, the wettable layer can be added over the adhesion layer.

The curable base adhesive 104 can be on and between the contact pads 108. The curable base adhesive 104 can be on and partially around the contact pad 108. The curable base adhesive 104 is defined as a curable, non-conductive material with adhesive properties. The curable base adhesive 104 can be a curable, non-conductive die adhesive, for example. The curable base adhesive 104 can fully cover the back side of the integrated circuit die 216. The curable base adhesive 104 can function to ensure that the instances of the contact pad 108 are electrically separate from each other.

For illustrative purposes, the curable base adhesive 104 is shown as not contacting the angled section of the trace 110, although it is understood that the curable base adhesive 104 could cover a larger area than is covered by the integrated circuit die 216. For example, the curable base material could cover a portion of the angled section of the trace 110 without contacting the bond finger 112.

It has been discovered that the curable base adhesive 104 around a plurality of the contact pad 108 allows the integrated circuit packaging system 100 to be formed as a thinner package because the integrated circuit packaging system 100 can be formed without a laminate substrate. For example, due to the redistribution layer 114 being held in place by the curable base adhesive 104 and the module encapsulation 102 rather than a laminate substrate, the integrated circuit packaging system 100 can be formed as a low-profile package since the integrated circuit packaging system 100 will have fewer components than a package that has a laminate substrate.

The integrated circuit die 216 can be attached to the contact pad 108 by the curable base adhesive 104. The integrated circuit die 216 can be electrically connected to the bond finger 112 by the chip interconnect 218. For example, the chip interconnect 218 can connect the integrated circuit die 216 to the bond finger 112, and the trace 110 can connect the bond finger 112 to the contact pad 108. In this example, the chip interconnect 218 can be a bond wire or bond ribbon.

The module encapsulation 102 can be formed on the integrated circuit die 216, the bond finger 112, the curable base adhesive 104, and the chip interconnect 218. The module encapsulation 102 is defined as a solid protective molding for the integrated circuit packaging system 100. The module encapsulation 102 can cover one side of the redistribution layer 114 while leaving the other side exposed. The module encapsulation 102 can fully cover the integrated circuit die 216 and can contact the curable base adhesive 104. For example, the module encapsulation 102 can include an epoxy molding compound or a moldable underfill. The module encapsulation 102 can contact the module adhesive 432.

The module interconnect 434 can connect the bond finger 112 and the base device 424. The module interconnects 434 can be different types of electrical interconnects. For example, the module interconnect 434 can be a formed lead, a bond wire, a bond ribbon, or a strap. In this example, the module interconnect 434 can be on the bond finger 112 and the chip carrier 320 of the base device 424.

The package encapsulation 436 is defined as a cover on integrated circuit components for electrical and environmental protection. For example, the package encapsulation 436 can be a film assisted molding, epoxy molding, or other protective molding, and can protect sensitive components from moisture, dust and other contamination. The package encapsulation 436 can be formed on the base device 424, the module interconnect 434, and the integrated circuit packaging system 100.

The package encapsulation 436 can have planar sides that are coplanar with the outermost sides of the base device 424. For example, the planar sides of the package encapsulation 436 can be coplanar with the non-horizontal sides of the chip carrier 320.

The top side of the package encapsulation 436 can have various configurations. For example, the top side of the package encapsulation 436 can expose the contact pad 108 and the curable base adhesive 104. Also for example, the package encapsulation 436 can fully cover the module interconnect 434, and as a result, can fully cover the bond finger 112. The contact pad 108 exposed from the package encapsulation 436 can function to connect to other integrated circuit devices or next level systems (not shown). The top side of the package encapsulation 436 can be planar.

Figure 5:
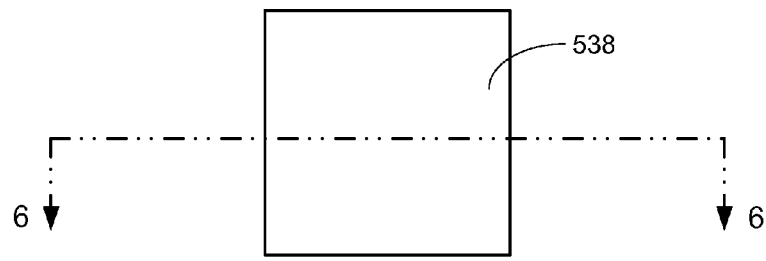
FIG. 5 is a bottom view of a sacrificial carrier in a manufacturing step of the integrated circuit packaging system of FIG. 2.

Referring now to FIG. 5, therein is shown a bottom view of a sacrificial carrier 538 in a manufacturing step of the integrated circuit packaging system 100 of FIG. 2. The sacrificial carrier 538 is defined as a temporary structure for maintaining the position of a conductive pattern. The sacrificial carrier 538 can be made from many different materials. For example, the sacrificial carrier 538 can be made from a metal, a plastic, ceramic, or an organic polymer. The sacrificial carrier 538 can be manufactured in various ways. For example, the sacrificial carrier 538 can be formed, stamped, cut, or etched. The sacrificial carrier 538 can be made from a processed metal such as copper, zinc, or tin. The sacrificial carrier 538 can be formed as a sheet of many instances of the sacrificial carrier 538.

Figure 6:
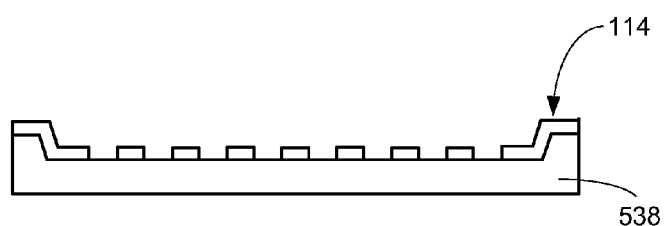
FIG. 6 is a cross-sectional view of the sacrificial carrier along the section line 6-6 of FIG. 5.

Referring now to FIG. 6, therein is shown a cross-sectional view of the sacrificial carrier 538 along the section line 6-6 of FIG. 5. The sacrificial carrier 538 is shown with the redistribution layer 114 formed on the sacrificial carrier 538. The shape of the sacrificial carrier 538 can determine the contours of the redistribution layer 114 and the interconnect pattern between the elements of the redistribution layer 114.

The redistribution layer 114 can be formed in various steps. For example, a protection layer can be formed on the sacrificial carrier 538 by masking then plating, sputtering, or chemical vapor deposition. Further deposition of metal to form the redistribution layer 114 can occur after further processing and removal of the sacrificial carrier 538, to be described below. The protection layer of the redistribution layer 114 can resist the removal process of the sacrificial carrier 538.

The redistribution layer 114 can be formed from a metal dissimilar to the metal or other material used in the sacrificial carrier 538 to prevent too much adhesion between the redistribution layer 114 and the sacrificial carrier 538. The lack of similarity between the metal used in the redistribution layer 114 and the sacrificial carrier 538 can augment the ease of later removal of the sacrificial carrier 538. For example, the redistribution layer 114 can resist etching while the sacrificial carrier 538 can be easily etched, allowing for selective removal of the sacrificial carrier 538 while leaving the redistribution layer 114.

Figure 7:
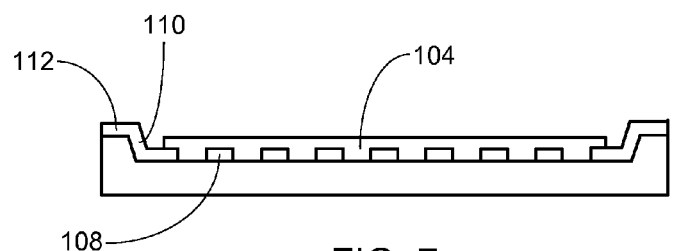
FIG. 7 is the structure of FIG. 6 in applying the curable base adhesive on the contact pad and the trace.

Referring now to FIG. 7, therein is shown the structure of FIG. 6 in applying the curable base adhesive 104 on the contact pad 108 and the trace 110. The curable base adhesive 104 can be applied to fully cover the contact pad 108 and a portion of the trace 110. The curable base adhesive 104 can contact only the contact pad 108 and the trace 110 without being in contact with the bond finger 112. The curable base adhesive 104 can be applied so as to fill the spaces between the contact pads 108.

Figure 8:
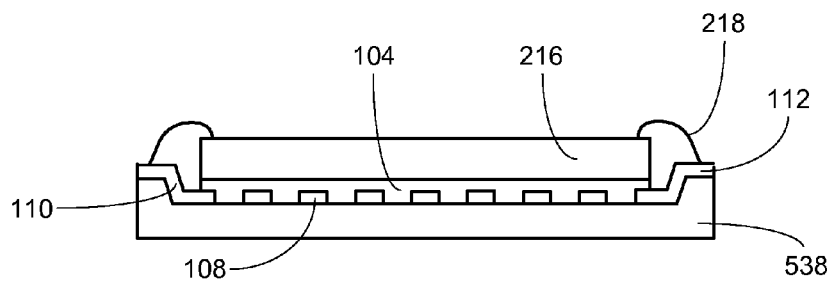
FIG. 8 is the structure of FIG. 7 in coupling the integrated circuit die to the bond finger and to the contact pad through the trace.

Referring now to FIG. 8, therein is shown the structure of FIG. 7 in coupling the integrated circuit die 216 to the bond finger 112 and to the contact pad 108 through the trace 110. The integrated circuit die 216 can be positioned on the curable base adhesive 104 for attachment. The chip interconnect 218 can be connected on the integrated circuit die 216 and the bond finger 112. For example, the chip interconnect 218 can be a bond wire or a bond ribbon.

After the integrated circuit die 216 is positioned on the curable base adhesive 104, the curable base adhesive 104 can be cured. After curing, the curable base adhesive 104 can be solid and can contact the sacrificial carrier 538 on the same plane as the contact pad 108.

Figure 9:
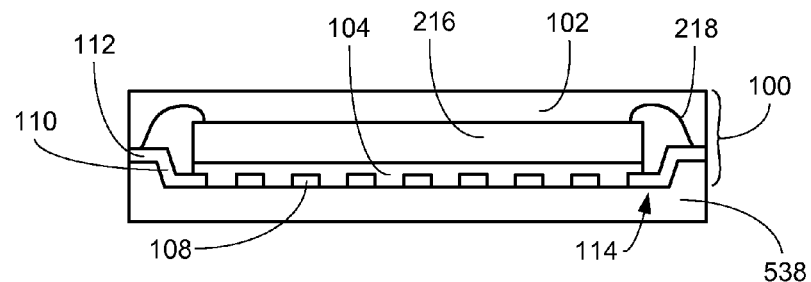
FIG. 9 is the structure of FIG. 8 in forming the module encapsulation on the integrated circuit die.

Referring now to FIG. 9, therein is shown the structure of FIG. 8 in forming the module encapsulation 102 on the integrated circuit die 216. The module encapsulation 102 can be formed on the integrated circuit die 216, the chip interconnect 218, the bond finger 112, a portion of the trace 110, and the curable base adhesive 104. The module encapsulation 102 can be formed with planar vertical sides which are coplanar with the outermost edges of the bond finger 112. The module encapsulation 102 can have a horizontal side opposite the curable base adhesive 104 that can be planar. The horizontal side of the module encapsulation 102 can be formed from a molding compound or moldable underfill using a mold chase and a curing step if necessary.

The integrated circuit packaging system 100 can be completed after removal of the sacrificial carrier 538. The sacrificial carrier 538 can be removed in different ways. For example, the sacrificial carrier 538 can be removed via an etching process, planarization followed by etching, or even by heating or cooling the sacrificial carrier 538 and the integrated circuit packaging system 100. In the previous example of heating or cooling the sacrificial carrier 538, differing rates of thermal expansion and contraction between the sacrificial carrier 538 and the redistribution layer 114 can facilitate removal of the sacrificial carrier 538 without damage.

It has been discovered that if the metal used in the redistribution layer 114 and the curable base adhesive 104 are chosen with different rates of thermal expansion than the sacrificial carrier 538, the sacrificial carrier 538 can be removed by heating or cooling without causing damage unlike an etching process. The removal of the sacrificial carrier 538 by heating or cooling can allow the reuse of the sacrificial carrier 538, saving on material costs and simplifying production.

After removal of the sacrificial carrier 538, the redistribution layer 114 can have layers added on top of the protection layer, for example. As an example, on the protection layer of the redistribution layer 114 can be added an adhesion layer and a wettable layer. The redistribution layer 114 can also include a diffusion barrier layer. The wettable layer can be made from a metal such as gold or nickel.

It has been discovered that because there is no other metal exposed from the integrated circuit packaging system 100 besides the redistribution layer 114, addition of other metals is simplified leading to lower production costs and faster manufacturing. For example, other layers of metal such as the adhesion layer and the wettable layer can be added via plating, dipping, sputtering, or chemical vapor deposition. Other layers of metal can be deposited on the redistribution layer 114 more easily because deposited metals will not readily stick to the curable base adhesive 104 or the module encapsulation 102 and therefore masking will be unnecessary.

For illustrative purposes, the redistribution layer 114 is described as having other layers deposited on the entirety of the redistribution layer 114 though it is understood that more selective plating is possible. For example, if a wettable layer such as gold or nickel is used, only the bond finger 112 and the contact pad 108 can be plated. The trace 110 can be free of the wettable layer due to masking. Also for example, only the bond finger 112 can be plated with a wettable layer by carefully controlling the height of dipping, by masking, or other method of selective deposition. After selective plating, the trace 110 can remain coplanar with the curable base adhesive 104, for example. As a further example, only the contact pad 108 can have extra layers of metal deposited to facilitate the use of the contact pad 108 as a test pad.

Figure 10:
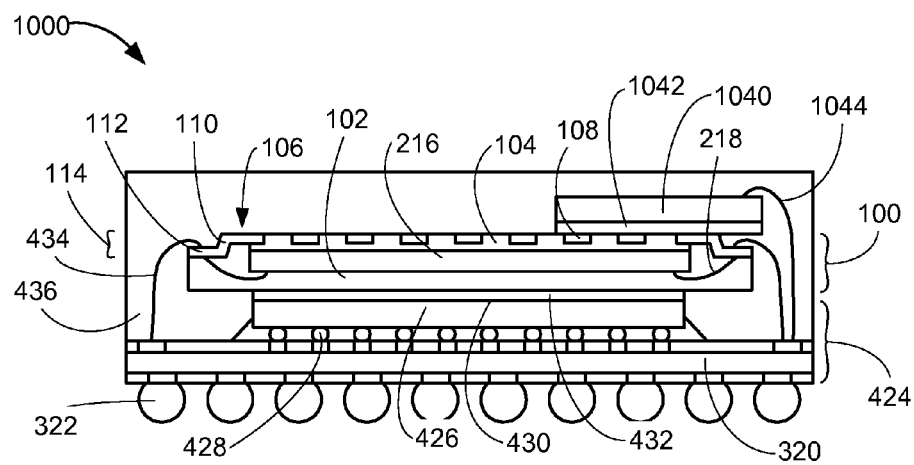
FIG. 10 is a cross-sectional view of an integrated circuit packaging system as exemplified by the bottom view of FIG. 3 and along the section line 4-4 of FIG. 3 in a third embodiment of the present invention.

Referring now to FIG. 10, therein is shown a cross-sectional view of an integrated circuit packaging system 1000 as exemplified by the bottom view of FIG. 3 and along the section line 4-4 of FIG. 3 in a third embodiment of the present invention. The integrated circuit packaging system 1000 is shown having the base device 424, the module interconnect 434, the integrated circuit packaging system 100, a top device 1040, the external interconnect 322, and the package encapsulation 436, as an example.

The integrated circuit packaging system 100 is shown having the integrated circuit die 216, the chip interconnect 218, the module encapsulation 102, the curable base adhesive 104, and the redistribution layer 114. For example, the integrated circuit die 216 can be a wire-bond chip.

The base device 424 can include the chip carrier 320, the base die 426, and the internal interconnect 428. The base device 424 can have the module adhesive 432 on the base device 424. The base device 424 can be different types of integrated circuits. For example, the base device 424 can include a flip chip, a wire-bond chip, or a pre-formed package.

The module adhesive 432 is defined as an adhesive material for attaching other components to the base device 424. For example, the module adhesive 432 can be a wire-in-film adhesive, a die attach adhesive, or a thermally conductive adhesive.

The internal interconnect 428 is defined as an electrical connector for connecting the components in the base device 424 to other components within the base device 424. For example, the internal interconnect 428 can be a solder ball, a metallic bump, a bond wire, a bond ribbon, or a conductive column. The internal interconnect 428 can be on the base die 426 and the chip carrier 320. In this example, the internal interconnect 428 can also support the base die 426 over the chip carrier 320.

The base device 424 can have the device top surface 430. The device top surface 430 is defined as the uppermost planar surface of the base device 424. For example, the device top surface 430 can be the back side of the base die 426. The device top surface 430 can be completely covered by the module adhesive 432. The module adhesive 432 can be used to attach the integrated circuit packaging system 100 to the device top surface 430 of the base device 424. The module adhesive 432 can be on and between the device top surface 430 and the integrated circuit packaging system 100.

The redistribution layer 114 can include a plurality of the peripheral interconnects 106 in a pattern. The peripheral interconnect 106 can include the bond finger 112, the contact pad 108 vertically offset from the bond finger 112, and the trace 110 electrically connecting the bond finger 112 and the contact pad 108. There can be a single instance of the contact pad 108 connected to each instance of the bond finger 112 by a corresponding instance of the trace 110.

The vertical offset of the contact pad 108 and the bond finger 112 can have the non-active side of the integrated circuit die 216 coplanar with the exposed surface of the bond finger 112. This vertical offset can allow for a lower profile package as the vertical offset can have enough space to allow for a bond wire to be attached to the bond finger 112 without going above the level of the contact pad 108.

The contact pad 108 can be exposed from the curable base adhesive 104 and the bond finger 112 can be exposed from the module encapsulation 102. The contact pad 108 can function as a bond site or as a test site. If the contact pad 108 is used as a test pad, the contact pad 108 can have a thicker layer of metal on the outer surface of the contact pad 108 in order to minimize the damage done to the contact pad 108 in the standard course of testing.

The contact pad 108 can be round in shape, though it is understood that the contact pad 108 can be different shapes based on need. For example, the contact pad 108 can be square, oval, rectangular, or other regular shape. The bond finger 112 is shown as rectangular in shape, though it is understood that the bond finger 112 can be different shapes as necessary. For example, the bond finger 112 can be square, oval, trapezoidal, or irregularly shaped.

The trace 110 can connect the contact pad 108 and the bond finger 112 so that the contact pad 108 and the bond finger 112 are electrically connected. The contact pads 108 can be arranged in an array.

It has been discovered that having the contact pad 108 and the bond finger 112 both available for connection allows for testing the integrated circuit packaging system 100 while leaving the contact pad 108 or the bond finger 112 undamaged. For example, if the contact pad 108 is used as a test site, the bond finger 112 will remain undamaged but every connection in the integrated circuit packaging system 100 can be tested.

The redistribution layer 114 can be formed from metal in various ways. For example, the redistribution layer 114 can be formed by masking then plating, sputtering, or chemical vapor deposition. The redistribution layer 114 can be formed such that the contact pad 108 is at a different vertical height than the bond finger 112. The difference in vertical height can create a bend in the trace 110 that connects the bond finger 112 to the contact pad 108.

The trace 110 can have a section which is coplanar with the bond finger 112 and another section coplanar with the contact pad 108. The trace 110 can also have a section between the previously mentioned coplanar sections which is at an obtuse angle relative to the coplanar sections. The angled section of the trace 110 can traverse the difference in vertical height between the bond finger 112 and the contact pad 108 for connection.

It has been discovered that the bond finger 112 at a different vertical height than the contact pad 108 allows for an easily testable low-profile package. For example, with the bond finger 112 vertically offset lower than the contact pad 108, bond wires or z-interconnects on the bond finger 112 can be encapsulated while still leaving the contact pad 108 exposed for further connection without adding extra height to the package. Also for example, the vertical offset between the bond finger 112 and the contact pad 108 while connected via the trace 110 allows redistribution of signals without adding extra vertical height because bond wires or z-interconnects can be connected to the bond finger 112 without the necessity of encapsulating the bond wires at a height greater than the contact pad 108. As a further example, since the bond finger 112 and the contact pad 108 are electrically connected, the contact pad 108 can be used as a test site so that the bond finger 112 remains undamaged for easy connection to a tested package.

The redistribution layer 114 can be composed of multiple metal layers. For example, the redistribution layer 114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 114 can be formed in many separate steps. For example, the protection layer can protect against etching, and the adhesion layer can be deposited after etching. Also for example, the wettable layer can be added over the adhesion layer.

The curable base adhesive 104 can be on and between the contact pads 108. The curable base adhesive 104 can be on and partially around the contact pad 108. The curable base adhesive 104 is defined as a curable, non-conductive material with adhesive properties. The curable base adhesive 104 can be a curable, non-conductive die adhesive, for example. The curable base adhesive 104 can fully cover the back side of the integrated circuit die 216. The curable base adhesive 104 can function to ensure that the instances of the contact pad 108 are electrically separate from each other.

For illustrative purposes, the curable base adhesive 104 is shown as not contacting the angled section of the trace 110, although it is understood that the curable base adhesive 104 could cover a larger area than is covered by the integrated circuit die 216. For example, the curable base material could cover a portion of the angled section of the trace 110 without contacting the bond finger 112.

It has been discovered that the curable base adhesive 104 around a plurality of the contact pad 108 allows the integrated circuit packaging system 100 to be formed as a thinner package because the integrated circuit packaging system 100 can be formed without a laminate substrate. For example, due to the redistribution layer 114 being held in place by the curable base adhesive 104 and the module encapsulation 102 rather than a laminate substrate, the integrated circuit packaging system 100 can be formed as a low-profile package since the integrated circuit packaging system 100 will have fewer components than a package that has a laminate substrate.

The integrated circuit die 216 can be attached to the contact pad 108 by the curable base adhesive 104. The integrated circuit die 216 can be electrically connected to the bond finger 112 by the chip interconnect 218. For example, the chip interconnect 218 can connect the integrated circuit die 216 to the bond finger 112, and the trace 110 can connect the bond finger 112 to the contact pad 108. In this example, the chip interconnect 218 can be a bond wire or bond ribbon.

The module encapsulation 102 can be formed on the integrated circuit die 216, the bond finger 112, the curable base adhesive 104, and the chip interconnect 218. The module encapsulation 102 is defined as a solid protective molding for the integrated circuit packaging system 100. The module encapsulation 102 can cover one side of the redistribution layer 114 while leaving the other side exposed. The module encapsulation 102 can fully cover the integrated circuit die 216 and can contact the curable base adhesive 104. For example, the module encapsulation 102 can include an epoxy molding compound or a moldable underfill. The module encapsulation 102 can contact the module adhesive 432.

The module interconnect 434 can connect the bond finger 112 and the base device 424. The module interconnects 434 can be different types of electrical interconnects. For example, the module interconnect 434 can be a formed lead, a bond wire, a bond ribbon, or a strap. In this example, the module interconnect 434 can be on the bond finger 112 and the chip carrier 320 of the base device 424.

The top device 1040 can be mounted on the integrated circuit packaging system 100. The top device 1040 can include a flip chip, a wire-bond chip, a passive device, or a pre-formed package. The top device 1040 can be attached to the integrated circuit packaging system 100 using a top device adhesive 1042. The top device adhesive 1042 can be on and between the integrated circuit packaging system 100 and the top device 1040.

The top device 1040 can connect to the base device 424 using a top interconnect 1044. The top interconnect 1044 can take different forms. For example, the top interconnect 1044 can be a bond wire, a bond ribbon, a strap, or a formed lead.

The package encapsulation 436 is defined as a cover on integrated circuit components for electrical and environmental protection. For example, the package encapsulation 436 can be a film assisted molding, epoxy molding, or other protective molding, and can protect sensitive components from moisture, dust and other contamination. The package encapsulation 436 can be formed on the base device 424, the module interconnect 434, the top device 1040, the top interconnect 1044, and the integrated circuit packaging system 100.

The package encapsulation 436 can have planar sides that are coplanar with the outermost sides of the base device 424.

For example, the planar sides of the package encapsulation 436 can be coplanar with the non-horizontal sides of the chip carrier 320.

The top side of the package encapsulation 436 can have various configurations. For example, the top side of the package encapsulation 436 can be planar or the top side of the package encapsulation 436 can have characteristics matching a mold used to form the package encapsulation 436. Also for example, the package encapsulation 436 can fully cover the module interconnect 434, and as a result, can fully cover the bond finger 112. The package encapsulation 436 can fully cover the integrated circuit packaging system 100, the top device 1040, and the top interconnect 1044. The top side of the package encapsulation 436 can be planar.

Figure 11:
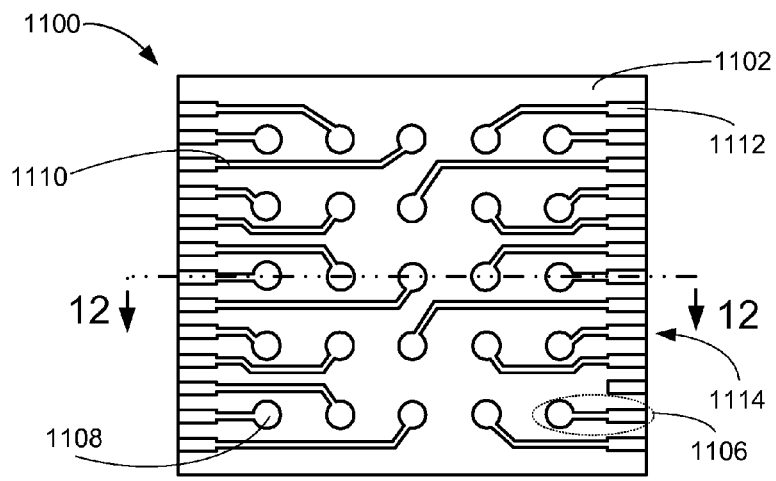
FIG. 11 is a top view of an integrated circuit packaging system in a fourth embodiment of the present invention.

Referring now to FIG. 11, therein is shown a top view of an integrated circuit packaging system 1100 in a fourth embodiment of the present invention. The integrated circuit packaging system 1100 is shown with a module encapsulation 1102 and a peripheral interconnect 1106.

The peripheral interconnects 1106 can form a redistribution layer 1114. The peripheral interconnect 1106 can include a contact pad 1108, a trace 1110, and a bond finger 1112. The peripheral interconnect 1106 is defined as a conductive structure terminating on the periphery of a component. For example, the peripheral interconnect 1106 can redistribute a signal from the edge of the integrated circuit packaging system 1100 to the interior of the integrated circuit packaging system 1100, or vice-versa. The contact pad 1108 can be directly connected to the trace 1110, which can in turn be connected directly to the bond finger 1112.

The trace 1110 can have a width that is much narrower than the width of the contact pad 1108 and the bond finger 1112. The trace 1110 can be formed from the same material as the contact pad 1108 and the bond finger 1112.

The size differential between the trace 1110 and the contact pad 1108 can function to keep a solder ball on the contact pad 1108 from migrating to the trace 1110 because of the surface tension of the solder, for example. Also for example, microstructures such as holes or depressions can be formed on the trace 1110 next to the contact pad 1108 in order to prevent a solder ball from deforming and moving off the contact pad 1108. As a further example, the relatively narrow width of the trace 1110 as compared to the contact pad 1108 and the bond finger 1112 can help redistribute signals while minimizing the chance of electrical shorts and crosstalk.

The bond finger 1112, the contact pad 1108, and the trace 1110 can be embedded in but exposed from the module encapsulation 1102. The bond fingers 1112 can be arranged on any number of the sides of the integrated circuit packaging system 1100 from just one side to two sides in any configuration including opposite each other, to all four sides.

Figure 12:
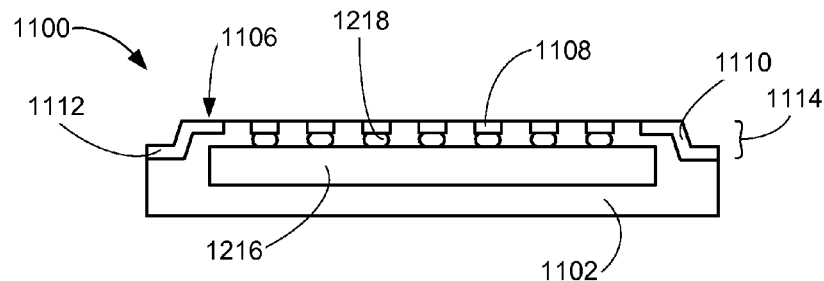
FIG. 12 is a cross-sectional view of the integrated circuit packaging system along the section line 12-12 of FIG. 11.

Referring now to FIG. 12, therein is shown a cross-sectional view of the integrated circuit packaging system 1100 along the section line 12-12 of FIG. 11. The integrated circuit packaging system 1100 is shown having an integrated circuit die 1216, a chip interconnect 1218, the module encapsulation 1102, and the redistribution layer 1114. For example, the integrated circuit die 1216 can be a flip chip.

The redistribution layer 1114 can include a plurality of the peripheral interconnects 1106 in a pattern. The peripheral interconnect 1106 can include the bond finger 1112, the contact pad 1108 vertically offset from the bond finger 1112, and the trace 1110 electrically connecting the bond finger 1112 and the contact pad 1108. There can be a single instance of the contact pad 1108 connected to each instance of the bond finger 1112 by a corresponding instance of the trace 1110.

The vertical offset of the contact pad 1108 and the bond finger 1112 can have the non-active side of the integrated circuit die 1216 coplanar with the exposed surface of the bond finger 1112. This vertical offset can allow for a lower profile package as the vertical offset can have enough space to allow for a bond wire to be attached to the bond finger 1112 without going above the level of the contact pad 1108.

The contact pad 1108, the trace 1110, and the bond finger 1112 can be exposed from the module encapsulation 1102. The contact pad 1108 can function as a bond site or as a test site. If the contact pad 1108 is used as a test pad, the contact pad 1108 can have a thicker layer of metal on the outer surface of the contact pad 1108 in order to minimize the damage done to the contact pad 1108 in the standard course of testing.

The contact pad 1108 can be round in shape, though it is understood that the contact pad 1108 can be different shapes based on need. For example, the contact pad 1108 can be square, oval, rectangular, or other regular shape. The bond finger 1112 is shown as rectangular in shape, though it is understood that the bond finger 1112 can be different shapes as necessary. For example, the bond finger 1112 can be square, oval, trapezoidal, or irregularly shaped.

The trace 1110 can connect the contact pad 1108 and the bond finger 1112 so that the contact pad 1108 and the bond finger 1112 are electrically connected. The contact pads 1108 can be arranged in an array.

It has been discovered that having the contact pad 1108 and the bond finger 1112 both available for connection allows for testing the integrated circuit packaging system 1100 while leaving the contact pad 1108 or the bond finger 1112 undamaged. For example, if the contact pad 1108 is used as a test site, the bond finger 1112 will remain undamaged but every connection in the integrated circuit packaging system 1100 can be tested.

The redistribution layer 1114 can be formed from metal in various ways. For example, the redistribution layer 1114 can be formed by masking then plating, sputtering, or chemical vapor deposition. The redistribution layer 1114 can be formed such that the contact pad 1108 is at a different vertical height than the bond finger 1112. The difference in vertical height can create a bend in the trace 1110 that connects the bond finger 1112 to the contact pad 1108.

The trace 1110 can have a section which is coplanar with the bond finger 1112 and another section coplanar with the contact pad 1108. The trace 1110 can also have a section between the previously mentioned coplanar sections which is at an obtuse angle relative to the coplanar sections. The angled section of the trace 1110 can traverse the difference in vertical height between the bond finger 1112 and the contact pad 1108 for connection.

It has been discovered that the bond finger 1112 at a different vertical height than the contact pad 1108 allows for an easily testable low-profile package. For example, with the bond finger 1112 vertically offset lower than the contact pad 1108, bond wires or z-interconnects on the bond finger 1112 can be encapsulated while still leaving the contact pad 1108 exposed for further connection without adding extra height to the package. Also for example, the vertical offset between the bond finger 1112 and the contact pad 1108 while connected via the trace 1110 allows redistribution of signals without adding extra vertical height because bond wires or z-interconnects can be connected to the bond finger 1112 without the necessity of encapsulating the bond wires at a height greater than the contact pad 1108. As a further example, since the bond finger 1112 and the contact pad 1108 are electrically connected, the contact pad 1108 can be used as a test site so that the bond finger 1112 remains undamaged for easy connection to a tested package.

The redistribution layer 1114 can be composed of multiple metal layers. For example, the redistribution layer 1114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 1114 can be formed in many separate steps. For example, the protection layer can protect against etching, and the adhesion layer can be deposited after etching. Also for example, the wettable layer can be added over the adhesion layer.

The integrated circuit die 1216 can be attached to the contact pad 1108 by the module encapsulation 1102 and the chip interconnect 1218. The integrated circuit die 1216 can be electrically connected to the contact pad 1108 by the chip interconnect 1218. For example, the chip interconnect 1218 can connect the integrated circuit die 1216 to the contact pad 1108, and the trace 1110 can connect the bond finger 1112 to the contact pad 1108. In this example, the chip interconnect 1218 can be a solder ball, conductive bump, or a metal pillar.

The module encapsulation 1102 can be formed on the integrated circuit die 1216, the bond finger 1112, the contact pad 1108, and the chip interconnect 1218. The module encapsulation 1102 is defined as a solid protective molding for the integrated circuit packaging system 1100. For example, the module encapsulation 1102 can include an epoxy molding compound or a moldable underfill. The module encapsulation 1102 can cover one side of the redistribution layer 1114 while leaving the other side exposed. The module encapsulation 1102 can fully cover the integrated circuit die 1216 and can be on and between the contact pads 108.

It has been discovered that the module encapsulation 1102 around a plurality of the contact pad 1108 allows the integrated circuit packaging system 1100 to be formed as a thinner package because the integrated circuit packaging system 1100 can be formed without a laminate substrate. For example, due to the redistribution layer 1114 being held in place by the module encapsulation 1102 rather than a laminate substrate, the integrated circuit packaging system 1100 can be formed as a low-profile package since the integrated circuit packaging system 1100 will have fewer components than a package that has a laminate substrate.

Figure 13:
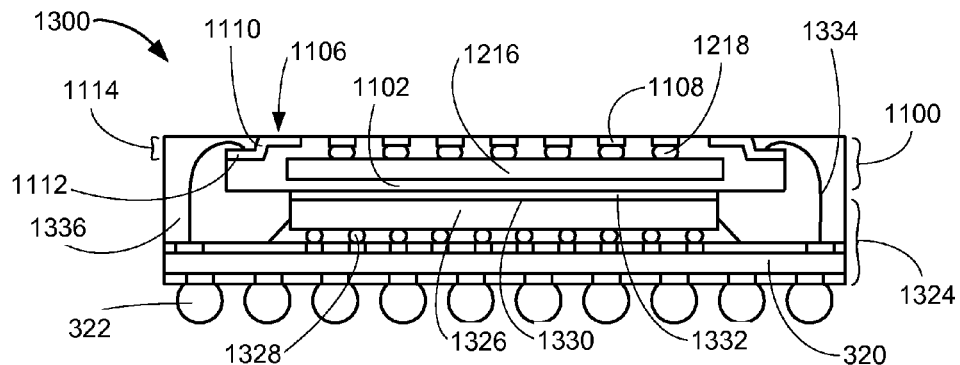
FIG. 13 is a cross-sectional view of an integrated circuit packaging system as exemplified by the bottom view of FIG. 3 and along the section line 4-4 of FIG. 3 in a fifth embodiment of the present invention.

Referring now to FIG. 13, therein is shown a cross-sectional view of an integrated circuit packaging system 1300 as exemplified by the bottom view of FIG. 3 and along the section line 4-4 of FIG. 3 in a fifth embodiment of the present invention. The integrated circuit packaging system 1300 is shown having a base device 1324, a module interconnect 1334, the integrated circuit packaging system 1100, the external interconnect 322, and a package encapsulation 1336, as an example.

The integrated circuit packaging system 1100 is shown having the integrated circuit die 1216, the chip interconnect 1218, the module encapsulation 1102, and the redistribution layer 1114. For example, the integrated circuit die 1216 can be a flip chip.

The redistribution layer 1114 can include a plurality of the peripheral interconnects 1106 in a pattern. The peripheral interconnect 1106 can include the bond finger 1112, the contact pad 1108 vertically offset from the bond finger 1112, and the trace 1110 electrically connecting the bond finger 1112 and the contact pad 1108. There can be a single instance of the contact pad 1108 connected to each instance of the bond finger 1112 by a corresponding instance of the trace 1110.

The vertical offset of the contact pad 1108 and the bond finger 1112 can have the non-active side of the integrated circuit die 1216 coplanar with the exposed surface of the bond finger 1112. This vertical offset can allow for a lower profile package as the vertical offset can have enough space to allow for a bond wire to be attached to the bond finger 1112 without going above the level of the contact pad 1108.

The base device 1324 can include the chip carrier 320, a base die 1326, and an internal interconnect 1328. The base device 1324 can have a module adhesive 1332 on the base device 1324. The base device 1324 can be different types of integrated circuits. For example, the base device 1324 can include a flip chip, a wire-bond chip, or a pre-formed package.

The module adhesive 1332 is defined as an adhesive material for attaching other components to the base device 1324. For example, the module adhesive 1332 can be a wire-in-film adhesive, a die attach adhesive, or a thermally conductive adhesive.

The internal interconnect 1328 is defined as an electrical connector for connecting the components in the base device 1324 to other components within the base device 1324. For example, the internal interconnect 1328 can be a solder ball, a metallic bump, a bond wire, a bond ribbon, or a conductive column. The internal interconnect 1328 can be on the base die 1326 and the chip carrier 320. In this example, the internal interconnect 1328 can also support the base die 1326 over the chip carrier 320.

The base device 1324 can have a device top surface 1330. The device top surface 1330 is defined as the uppermost planar surface of the base device 1324. For example, the device top surface 1330 can be the back side of the base die 1326. The device top surface 1330 can be completely covered by the module adhesive 1332. The module adhesive 1332 can be used to attach the integrated circuit packaging system 1100 to the device top surface 1330 of the base device 1324. The module adhesive 1332 can be on and between the device top surface 1330 and the integrated circuit packaging system 1100.

The contact pad 1108, the trace 1110, and the bond finger 1112 can be exposed from the module encapsulation 1102. The contact pad 1108 can function as a bond site or as a test site. If the contact pad 1108 is used as a test pad, the contact pad 1108 can have a thicker layer of metal on the outer surface of the contact pad 1108 in order to minimize the damage done to the contact pad 1108 in the standard course of testing.

The contact pad 1108 can be round in shape, though it is understood that the contact pad 1108 can be different shapes based on need. For example, the contact pad 1108 can be square, oval, rectangular, or other regular shape. The bond finger 1112 is shown as rectangular in shape, though it is understood that the bond finger 1112 can be different shapes as necessary. For example, the bond finger 1112 can be square, oval, trapezoidal, or irregularly shaped.

The trace 1110 can connect the contact pad 1108 and the bond finger 1112 so that the contact pad 1108 and the bond finger 1112 are electrically connected. The contact pads 1108 can be arranged in an array.

It has been discovered that having the contact pad 1108 and the bond finger 1112 both available for connection allows for testing the integrated circuit packaging system 1100 while leaving the contact pad 1108 or the bond finger 1112 undamaged. For example, if the contact pad 1108 is used as a test site, the bond finger 1112 will remain undamaged but every connection in the integrated circuit packaging system 1100 can be tested.

The redistribution layer 1114 can be formed from metal in various ways. For example, the redistribution layer 1114 can be formed by masking then plating, sputtering, or chemical vapor deposition. The redistribution layer 1114 can be formed such that the contact pad 1108 is at a different vertical height than the bond finger 1112. The difference in vertical height can create a bend in the trace 1110 that connects the bond finger 1112 to the contact pad 1108.

The trace 1110 can have a section which is coplanar with the bond finger 1112 and another section coplanar with the contact pad 1108. The trace 1110 can also have a section between the previously mentioned coplanar sections which is at an obtuse angle relative to the coplanar sections. The angled section of the trace 1110 can traverse the difference in vertical height between the bond finger 1112 and the contact pad 1108 for connection.

It has been discovered that the bond finger 1112 at a different vertical height than the contact pad 1108 allows for an easily testable low-profile package. For example, with the bond finger 1112 vertically offset lower than the contact pad 1108, bond wires or z-interconnects on the bond finger 1112 can be encapsulated while still leaving the contact pad 1108 exposed for further connection without adding extra height to the package. Also for example, the vertical offset between the bond finger 1112 and the contact pad 1108 while connected via the trace 1110 allows redistribution of signals without adding extra vertical height because bond wires or z-interconnects can be connected to the bond finger 1112 without the necessity of encapsulating the bond wires at a height greater than the contact pad 1108. As a further example, since the bond finger 1112 and the contact pad 1108 are electrically connected, the contact pad 1108 can be used as a test site so that the bond finger 1112 remains undamaged for easy connection to a tested package.

The redistribution layer 1114 can be composed of multiple metal layers. For example, the redistribution layer 1114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 1114 can be formed in many separate steps. For example, the protection layer can protect against etching, and the adhesion layer can be deposited after etching. Also for example, the wettable layer can be added over the adhesion layer.

The integrated circuit die 1216 can be attached to the contact pad 1108 by the module encapsulation 1102 and the chip interconnect 1218. The integrated circuit die 1216 can be electrically connected to the contact pad 1108 by the chip interconnect 1218. For example, the chip interconnect 1218 can connect the integrated circuit die 1216 to the contact pad 1108, and the trace 1110 can connect the bond finger 1112 to the contact pad 1108. In this example, the chip interconnect 1218 can be a solder ball, conductive bump, or a metal pillar.

The module encapsulation 1102 can be formed on the integrated circuit die 1216, the bond finger 1112, the contact pad 1108, and the chip interconnect 1218. The module encapsulation 1102 is defined as a solid protective molding for the integrated circuit packaging system 1100. For example, the module encapsulation 1102 can include an epoxy molding compound or a moldable underfill. The module encapsulation 1102 can cover one side of the redistribution layer 1114 while leaving the other side exposed. The module encapsulation 1102 can fully cover the integrated circuit die 1216 and can be on and between the contact pads 1108.

It has been discovered that the module encapsulation 1102 around a plurality of the contact pad 1108 allows the integrated circuit packaging system 1100 to be formed as a thinner package because the integrated circuit packaging system 1100 can be formed without a laminate substrate. For example, due to the redistribution layer 1114 being held in place by the curable base adhesive 1104 and the module encapsulation 1102 rather than a laminate substrate, the integrated circuit packaging system 1100 can be formed as a low-profile package since the integrated circuit packaging system 1100 will have fewer components than a package that has a laminate substrate.

The module interconnect 1334 can connect the bond finger 1112 and the base device 1324. The module interconnects 1334 can be different types of electrical interconnects. For example, the module interconnect 1334 can be a formed lead, a bond wire, a bond ribbon, or a strap. In this example, the module interconnect 1334 can be on the bond finger 1112 and the chip carrier 320 of the base device 1324.

The package encapsulation 1336 is defined as a cover on integrated circuit components for electrical and environmental protection. For example, the package encapsulation 1336 can be a film assisted molding, epoxy molding, or other protective molding, and can protect sensitive components from moisture, dust and other contamination. The package encapsulation 1336 can be formed on the base device 1324, the module interconnect 1334, and the integrated circuit packaging system 1100.

The package encapsulation 1336 can have planar sides that are coplanar with the outermost sides of the base device 1324. For example, the planar sides of the package encapsulation 1336 can be coplanar with the non-horizontal sides of the chip carrier 320.

The top side of the package encapsulation 1336 can have various configurations. For example, the top side of the package encapsulation 1336 can expose the contact pad 1108 and the module encapsulation 1102. Also for example, the package encapsulation 1336 can fully cover the module interconnect 1334, and as a result, can fully cover the bond finger 1112. The contact pad 1108 exposed from the package encapsulation 1336 can function to connect to other integrated circuit devices or next level systems (not shown). The top side of the package encapsulation 1336 can be planar.

Figure 14:
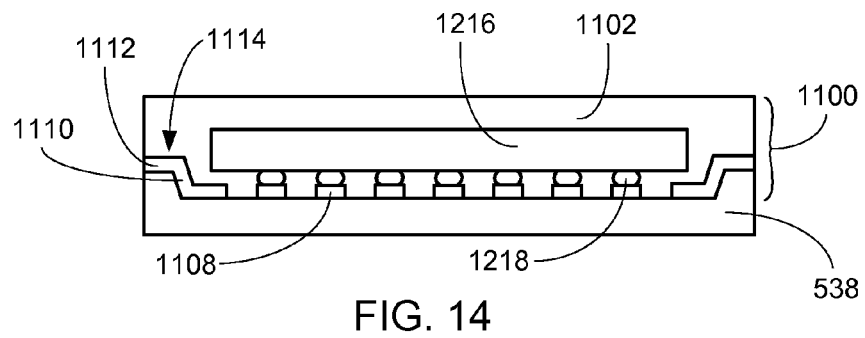
FIG. 14 is the structure of FIG. 12 in a manufacturing step of the integrated circuit packaging system 1100 of FIG. 11.

Referring now to FIG. 14, therein is shown the structure of FIG. 12 in a manufacturing step of the integrated circuit packaging system 1100 of FIG. 11. The integrated circuit packaging system 1100 is formed in a similar process to the integrated circuit packaging system 100 of FIG. 2, with differences to be described below.

The sacrificial carrier 538 has the redistribution layer 1114 deposited on the sacrificial carrier 538 in the same manner as the manufacture of the integrated circuit packaging system 100 of FIG. 2. The integrated circuit die 1216 can be a flip chip, for example. In this example, the integrated circuit die 1216 is first mounted on the contact pad 1108. The active side of the integrated circuit die 1216 can be attached to the contact pad 1108 with the chip interconnect 1218.

The module encapsulation 1102 can be applied on the active side of the integrated circuit die 1216, the chip interconnect 1218, and the contact pad 1108 after the integrated circuit die 1216 is attached to the contact pad 1108. The module encapsulation 1102 can include a curable underfill, a moldable underfill or an epoxy molding compound, for example. Also for example, the module encapsulation 1102 can be applied to the contact pad 1108 and the bond finger 1112, and enclose the integrated circuit die 1216 in a single step.

For example, a curable underfill can function as both the curable base adhesive 1104 of FIG. 1 and the module encapsulation 1102. The curable base adhesive 1104 and the module encapsulation 1102 can be applied in a single step on the contact pad 1108, the trace 1110, the bond finger 1112, and the integrated circuit die 1216.

The integrated circuit packaging system 1100 can be formed after curing the module encapsulation 1102, removal of the sacrificial carrier 538, and addition of metal layers on the contact pad 1108, the trace 1110, and the bond finger 1112. The integrated circuit packaging system 1100 can be completed after removal of the sacrificial carrier 538. The sacrificial carrier can be removed in different ways. For example, the sacrificial carrier 538 can be removed via an etching process, planarization followed by etching, or even by heating or cooling the sacrificial carrier 538 and the integrated circuit packaging system 1100. In the previous example of heating or cooling the sacrificial carrier 538, differing rates of thermal expansion and contraction between the sacrificial carrier 538 and the redistribution layer 1114 can facilitate removal of the sacrificial carrier 538 without damage.

It has been discovered that if the metal used in the redistribution layer 1114 and the curable base adhesive 1104 are chosen with different rates of thermal expansion than the sacrificial carrier 538, the sacrificial carrier 538 can be removed by heating or cooling without causing damage unlike an etching process. The removal of the sacrificial carrier 538 by heating or cooling can allow the reuse of the sacrificial carrier 538, saving on material costs and simplifying production.

After removal of the sacrificial carrier 538, the redistribution layer 1114 can have layers added on top of the protection layer, for example. As an example, on the protection layer of the redistribution layer 1114 can be added an adhesion layer and a wettable layer. The redistribution layer 1114 can also include a diffusion barrier layer. The wettable layer can be made from a metal that resists corrosion such as gold.

It has been discovered that because there is no other metal exposed from the integrated circuit packaging system 1100 besides the redistribution layer 1114, addition of other metals is simplified leading to lower production costs and faster manufacturing. For example, other layers of metal such as the adhesion layer and the wettable layer can be added via plating, dipping, sputtering, or chemical vapor deposition. Other layers of metal can be deposited on the redistribution layer 1114 more easily because deposited metals will not readily stick to the curable base adhesive 1104 or the module encapsulation 1102 and therefore masking can be unnecessary.

For illustrative purposes, the redistribution layer 1114 is described as having other layers deposited on the entirety of the redistribution layer 1114 though it is understood that more selective plating is possible. For example, if a wettable layer such as gold or nickel is used, only the bond finger 1112 and the contact pad 1108 can be plated. The trace 1110 can be free of the wettable layer due to masking. Also for example, only the bond finger 1112 can be plated with a wettable layer by carefully controlling the height of dipping, by masking, or other method of selective deposition. After selective plating, the trace 1110 can remain coplanar with the curable base adhesive 1104, for example. As a further example, only the contact pad 1108 can have extra layers of metal deposited to facilitate the use of the contact pad 1108 as a test pad.

Figure 15:
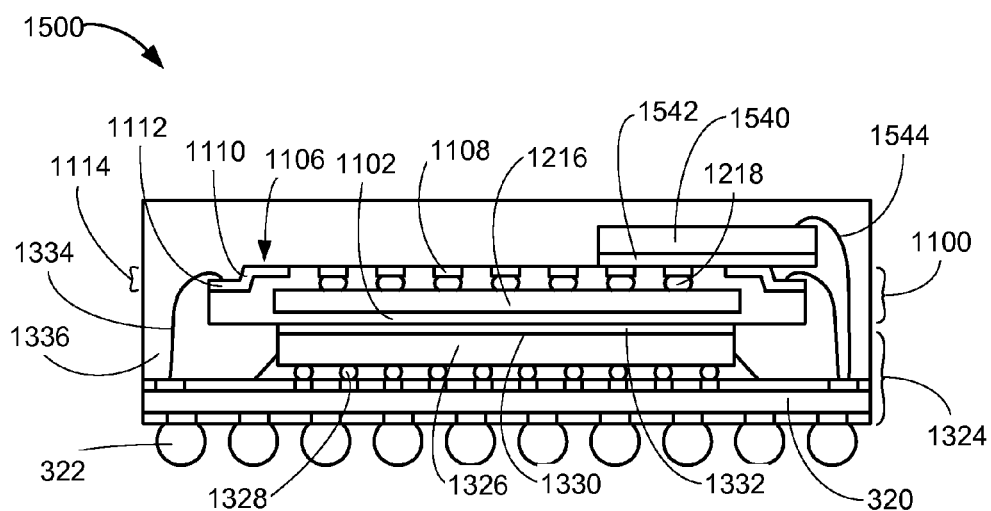
FIG. 15 is a cross-sectional view of an integrated circuit packaging system as exemplified by the bottom view of FIG. 3 and along the section line 4-4 of FIG. 3 in a sixth embodiment of the present invention.

Referring now to FIG. 15, therein is shown a cross-sectional view of an integrated circuit packaging system 1500 as exemplified by the bottom view of FIG. 3 and along the section line 4-4 of FIG. 3 in a sixth embodiment of the present invention. The integrated circuit packaging system 1500 is shown having the base device 1324, the module interconnect 1334, the integrated circuit packaging system 1100, a top device 1540, the external interconnect 322, and the package encapsulation 1336, as an example.

The integrated circuit packaging system 1100 is shown having the integrated circuit die 1216, the chip interconnect 1218, the module encapsulation 1102, and the redistribution layer 1114. For example, the integrated circuit die 1216 can be a flip chip.

The redistribution layer 1114 can include a plurality of the peripheral interconnects 1106 in a pattern. The peripheral interconnect 1106 can include the bond finger 1112, the contact pad 1108 vertically offset from the bond finger 1112, and the trace 1110 electrically connecting the bond finger 1112 and the contact pad 1108. There can be a single instance of the contact pad 1108 connected to each instance of the bond finger 1112 by a corresponding instance of the trace 1110.

The vertical offset of the contact pad 1108 and the bond finger 1112 can have the non-active side of the integrated circuit die 1216 coplanar with the exposed surface of the bond finger 1112. This vertical offset can allow for a lower profile package as the vertical offset can have enough space to allow for a bond wire to be attached to the bond finger 1112 without going above the level of the contact pad 1108.

The base device 1324 can include the chip carrier 320, the base die 1326, and the internal interconnect 1328. The base device 1324 can have the module adhesive 1332 on the base device 1324. The base device 1324 can be different types of integrated circuits. For example, the base device 1324 can include a flip chip, a wire-bond chip, or a pre-formed package.

The module adhesive 1332 is defined as an adhesive material for attaching other components to the base device 1324. For example, the module adhesive 1332 can be a wire-in-film adhesive, a die attach adhesive, or a thermally conductive adhesive.

The internal interconnect 1328 is defined as an electrical connector for connecting the components in the base device 1324 to other components within the base device 1324. For example, the internal interconnect 1328 can be a solder ball, a metallic bump, a bond wire, a bond ribbon, or a conductive column. The internal interconnect 1328 can be on the base die 1326 and the chip carrier 320. In this example, the internal interconnect 1328 can also support the base die 1326 over the chip carrier 320.

The base device 1324 can have the device top surface 1330. The device top surface 1330 is defined as the uppermost planar surface of the base device 1324. For example, the device top surface 1330 can be the back side of the base die 1326. The device top surface 1330 can be completely covered by the module adhesive 1332. The module adhesive 1332 can be used to attach the integrated circuit packaging system 1100 to the device top surface 1330 of the base device 1324. The module adhesive 1332 can be on and between the device top surface 1330 and the integrated circuit packaging system 1100.

The contact pad 1108, the trace 1110, and the bond finger 1112 can be exposed from the module encapsulation 1102. The contact pad 1108 can function as a bond site or as a test site. If the contact pad 1108 is used as a test pad, the contact pad 1108 can have a thicker layer of metal on the outer surface of the contact pad 1108 in order to minimize the damage done to the contact pad 1108 in the standard course of testing.

The contact pad 1108 can be round in shape, though it is understood that the contact pad 1108 can be different shapes based on need. For example, the contact pad 1108 can be square, oval, rectangular, or other regular shape. The bond finger 1112 is shown as rectangular in shape, though it is understood that the bond finger 1112 can be different shapes as necessary. For example, the bond finger 1112 can be square, oval, trapezoidal, or irregularly shaped.

The trace 1110 can connect the contact pad 1108 and the bond finger 1112 so that the contact pad 1108 and the bond finger 1112 are electrically connected. The contact pads 1108 can be arranged in an array.

It has been discovered that having the contact pad 1108 and the bond finger 1112 both available for connection allows for testing the integrated circuit packaging system 1100 while leaving the contact pad 1108 or the bond finger 1112 undamaged. For example, if the contact pad 1108 is used as a test site, the bond finger 1112 will remain undamaged but every connection in the integrated circuit packaging system 1100 can be tested.

The redistribution layer 1114 can be formed from metal in various ways. For example, the redistribution layer 1114 can be formed by masking then plating, sputtering, or chemical vapor deposition. The redistribution layer 1114 can be formed such that the contact pad 1108 is at a different vertical height than the bond finger 1112. The difference in vertical height can create a bend in the trace 1110 that connects the bond finger 1112 to the contact pad 1108.

The trace 1110 can have a section which is coplanar with the bond finger 1112 and another section coplanar with the contact pad 1108. The trace 1110 can also have a section between the previously mentioned coplanar sections which is at an obtuse angle relative to the coplanar sections. The angled section of the trace 1110 can traverse the difference in vertical height between the bond finger 1112 and the contact pad 1108 for connection.

It has been discovered that the bond finger 1112 at a different vertical height than the contact pad 1108 allows for an easily testable low-profile package. For example, with the bond finger 1112 vertically offset lower than the contact pad 1108, bond wires or z-interconnects on the bond finger 1112 can be encapsulated while still leaving the contact pad 1108 exposed for further connection without adding extra height to the package. Also for example, the vertical offset between the bond finger 1112 and the contact pad 1108 while connected via the trace 1110 allows redistribution of signals without adding extra vertical height because bond wires or z-interconnects can be connected to the bond finger 1112 without the necessity of encapsulating the bond wires at a height greater than the contact pad 1108. As a further example, since the bond finger 1112 and the contact pad 1108 are electrically connected, the contact pad 1108 can be used as a test site so that the bond finger 1112 remains undamaged for easy connection to a tested package.

The redistribution layer 1114 can be composed of multiple metal layers. For example, the redistribution layer 1114 can have a protection layer, an adhesion layer, a diffusion barrier layer, and a wettable layer. For example, the protection layer can resist etching for selective removal of surrounding material. The adhesion layer can function to increase adhesion of other metal layers to the protection layer. The diffusion barrier layer can prevent layers from bleeding into other layers. The wettable layer can function to provide an easily bondable surface for bond wires or to provide a surface attractive to solder.

The redistribution layer 1114 can be formed in many separate steps. For example, the protection layer can protect against etching, and the adhesion layer can be deposited after etching. Also for example, the wettable layer can be added over the adhesion layer.

The integrated circuit die 1216 can be attached to the contact pad 1108 by the module encapsulation 1102 and the chip interconnect 1218. The integrated circuit die 1216 can be electrically connected to the contact pad 1108 by the chip interconnect 1218. For example, the chip interconnect 1218 can connect the integrated circuit die 1216 to the contact pad 1108, and the trace 1110 can connect the bond finger 1112 to the contact pad 1108. In this example, the chip interconnect 1218 can be a solder ball, conductive bump, or a metal pillar.

The module encapsulation 1102 can be formed on the integrated circuit die 1216, the bond finger 1112, the contact pad 1108, and the chip interconnect 1218. The module encapsulation 1102 is defined as a solid protective molding for the integrated circuit packaging system 1100. For example, the module encapsulation 1102 can include an epoxy molding compound or a moldable underfill. The module encapsulation 1102 can cover one side of the redistribution layer 1114 while leaving the other side exposed. The module encapsulation 1102 can fully cover the integrated circuit die 1216 and can be on and between the contact pads 1108.

It has been discovered that the module encapsulation 1102 around a plurality of the contact pad 1108 allows the integrated circuit packaging system 1100 to be formed as a thinner package because the integrated circuit packaging system 1100 can be formed without a laminate substrate. For example, due to the redistribution layer 1114 being held in place by the curable base adhesive 1104 and the module encapsulation 1102 rather than a laminate substrate, the integrated circuit packaging system 1100 can be formed as a low-profile package since the integrated circuit packaging system 1100 will have fewer components than a package that has a laminate substrate.

The module interconnect 1334 can connect the bond finger 1112 and the base device 1324. The module interconnects 1334 can be different types of electrical interconnects. For example, the module interconnect 1334 can be a formed lead, a bond wire, a bond ribbon, or a strap. In this example, the module interconnect 1334 can be on the bond finger 1112 and the chip carrier 320 of the base device 1324.

The top device 1540 can be mounted on the integrated circuit packaging system 1100. The top device 1540 can include a flip chip, a wire-bond chip, a passive device, or a pre-formed package. The top device 1540 can be attached to the integrated circuit packaging system 1100 using a top device adhesive 1542. The top device adhesive 1542 can be on and between the integrated circuit packaging system 1100 and the top device 1540.

The top device 1540 can connect to the base device 1324 using a top interconnect 1544. The top interconnect 1544 can take different forms. For example, the top interconnect 1544 can be a bond wire, a bond ribbon, a strap, or a formed lead.

The package encapsulation 1336 is defined as a cover on integrated circuit components for electrical and environmental protection. For example, the package encapsulation 1336 can be a film assisted molding, epoxy molding, or other protective molding, and can protect sensitive components from moisture, dust and other contamination. The package encapsulation 1336 can be formed on the base device 1324, the module interconnect 1334, the top device 1540, the top interconnect 1544, and the integrated circuit packaging system 1100.

The package encapsulation 1336 can have planar sides that are coplanar with the outermost sides of the base device 1324. For example, the planar sides of the package encapsulation 1336 can be coplanar with the non-horizontal sides of the chip carrier 320.

The top side of the package encapsulation 1336 can have various configurations. For example, the top side of the package encapsulation 1336 can be planar or the top side of the package encapsulation 1336 can have characteristics matching a mold used to form the package encapsulation 1336. Also for example, the package encapsulation 1336 can fully cover the module interconnect 1334, and as a result, can fully cover the bond finger 1112. The package encapsulation 1336 can fully cover the integrated circuit packaging system 1100, the top device 1540, and the top interconnect 1544. The top side of the package encapsulation 1336 can be planar.

Figure 16:
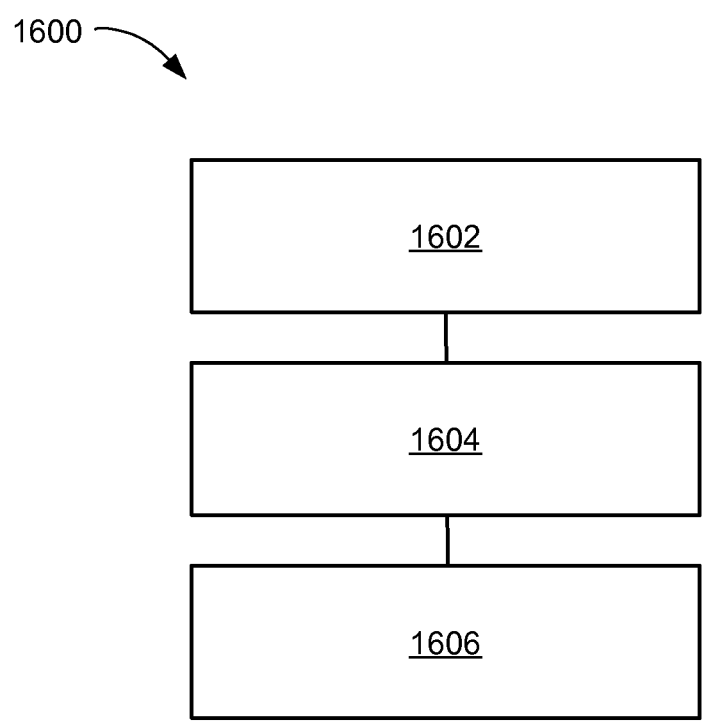
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: forming a peripheral interconnect having a bond finger and a contact pad with a trace in direct contact with the bond finger and the contact pad, the bond finger vertically offset from the contact pad in a block 1602; connecting an integrated circuit die and the bond finger in a block 1604; and forming a module encapsulation on the integrated circuit die, the bond finger and the trace exposed from the module encapsulation in a block 1606.

Thus, it has been discovered that the integrated circuit packaging system of the present invention furnishes important and heretofore unknown and unavailable solutions, capabilities, and functional aspects for economically manufacturing and testing low-profile integrated circuit devices.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a peripheral interconnect having a bond finger and a contact pad with a trace in direct contact with the bond finger and the contact pad, the bond finger vertically offset from the contact pad;
   connecting an integrated circuit die and the bond finger, a back side of the integrated circuit die is attached to a curable base adhesive, the curable base adhesive is on and between the contact pads;
   forming a module encapsulation on the integrated circuit die, wherein one side of the bond finger and the trace are covered in the module encapsulation, and the opposite side of the bond finger and the trace are exposed from the module encapsulation; and
   wherein the integrated circuit packaging system is manufactured without a substrate.

2. The method as claimed in claim 1 further comprising forming the curable base adhesive including exposing from the curable base adhesive the contact pad.

3. The method as claimed in claim 1 wherein forming the module encapsulation includes exposing from the module encapsulation the contact pad.

4. The method as claimed in claim 1 wherein forming a peripheral interconnect includes the trace is at an obtuse angle relative to the contact pad and the bond finger.

5. The method as claimed in claim 1 further comprising:
   providing a base device;
   mounting the integrated circuit die over the base device;
   connecting a module interconnect to the bond finger and the base device; and
   forming a package encapsulation on the base device and the bond finger, the package encapsulation covering the bond finger.

6. A method of manufacture of an integrated circuit packaging system comprising:
   forming an integrated circuit package comprising:
      forming a peripheral interconnect having a bond finger and a contact pad with a trace in direct contact with the bond finger and the contact pad, the bond finger vertically offset from the contact pad;
      connecting an integrated circuit die and the bond finger, a back side of the integrated circuit die is attached to a curable base adhesive, the curable base adhesive is on and between the contact pads;
      forming a module encapsulation on the integrated circuit, wherein one side of the bond finger and the trace are covered in the module encapsulation, and the opposite side of the bond finger and the trace are exposed from the module encapsulation; and
      wherein the integrated circuit package is formed without a substrate;
   providing a base device;
   mounting the integrated circuit package over the base device;
   connecting a module interconnect to the bond finger and the base device; and
   forming a package encapsulation on the base device, the package encapsulation covering the bond finger.

7. The method as claimed in claim 6 wherein forming the package encapsulation includes forming the package encapsulation exposing the contact pad.

8. The method as claimed in claim 6 further comprising mounting a top device on the contact pad.

9. The method as claimed in claim 6 further comprising connecting a chip interconnect on the integrated circuit die and the bond finger.

10. The method as claimed in claim 6 further comprising connecting a chip interconnect on the integrated circuit die and the contact pad.

11. An integrated circuit packaging system comprising:
    an integrated circuit package comprising:
    a peripheral interconnect having a bond finger and a contact pad with a trace in direct contact with the bond finger and the contact pad, the bond finger vertically offset from the contact pad;

an integrated circuit die connected to the bond finger, a back side of the integrated circuit die is attached to a curable base adhesive the curable base adhesive is on and between the contact pads;

a module encapsulation on the integrated circuit die, wherein one side of the bond finger and the trace are covered in the module encapsulation, and the opposite side of the bond finger and the trace are exposed from the module encapsulation; and wherein the integrated circuit package is without a substrate.

12. The system as claimed in claim 11 further comprising the curable base adhesive including the contact pad exposed from the curable base adhesive.

13. The system as claimed in claim 11 wherein the contact pad is exposed from the module encapsulation.

14. The system as claimed in claim 11 wherein the trace is at an obtuse angle relative to the contact pad and the bond finger.

15. The system as claimed in claim 11 further comprising:
a base device with the integrated circuit over the base device;
a module interconnect connected to the bond finger and the base device; and
a package encapsulation on the base device and the bond finger, the package encapsulation covering the bond finger.

16. The system as claimed in claim 11 wherein:
the trace is at an obtuse angle relative to the contact pad and the bond finger;
further comprising:
a base device with the integrated circuit package over the base device;
a module interconnect connected to the bond finger and the base device; and
a package encapsulation on the base device and the bond finger, the package encapsulation covering the bond finger.

17. The system as claimed in claim 16 wherein the package encapsulation exposes the contact pad.

18. The system as claimed in claim 16 further comprising a top device on the contact pad.

19. The system as claimed in claim 16 further comprising a chip interconnect connected on the integrated circuit die and the bond finger.

20. The system as claimed in claim 16 further comprising a chip interconnect connected on the integrated circuit die and the contact pad.

* * * * *